(12) United States Patent
Ikeda

(10) Patent No.: US 7,671,477 B2
(45) Date of Patent: Mar. 2, 2010

(54) TECHNIQUE FOR MODERATING STRESSES CAUSE BY A DIFFERENCE IN THERMAL EXPANSION COEFFIECIENTS BETWEEN A SUBSTRATE AND AN ELECTRONIC COMPONENT

(75) Inventor: Hironobu Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 67 days.

(21) Appl. No.: 11/566,885

(22) Filed: Dec. 5, 2006

(65) Prior Publication Data

US 2007/0090528 A1    Apr. 26, 2007

(30) Foreign Application Priority Data

May 12, 2005    (JP)    .............................. 2005-351285

(51) Int. Cl.
*H01L 23/48*    (2006.01)
*H01L 23/52*    (2006.01)

(52) U.S. Cl. ...................... 257/778; 257/779

(58) Field of Classification Search ......... 257/735–737, 257/777–780, E23.021, E23.033, E23.068, 257/E23.07, E21.511

See application file for complete search history.

(56) References Cited

U.S. PATENT DOCUMENTS 6,507,118 B1 *    1/2003    Schueller ..................... 257/778
6,894,399 B2 *    5/2005    Vu et al. ..................... 257/786

FOREIGN PATENT DOCUMENTS

| JP | 10-173006 | 6/1998 |
| JP | 11-284029 | 10/1999 |
| JP | 2000-58706 | 2/2000 |
| JP | 2000-277923 | 10/2000 |

\* cited by examiner

*Primary Examiner*—Hung Vu
(74) *Attorney, Agent, or Firm*—Dickstein Shapiro LLP (57) ABSTRACT

A device comprises a plurality of first electrodes which are arranged on a surface of a substrate at predetermined space, a component which has an elasticity and a longitudinal axis, a plurality of conductors which are applied to a surface of said component at predetermined space, and each of which are connected to a corresponding one of said first electrodes, and a plurality of second electrodes which are arranged on a surface of a electronic component at predetermined space, and each of which are connected to a corresponding one of said conductors.

18 Claims, 7 Drawing Sheets

1: CONNECTOR      2: BODY           7: CONDUCTOR
10: ELECTRONIC COMPONENT            11: SUBSTRATE
12: SOLDER        15: ELECTRODE

1: CONNECTOR    2: BODY    7: CONDUCTOR
10: ELECTRONIC COMPONENT    11: SUBSTRATE
12: SOLDER    15: ELECTRODE

Fig. 2

1: CONNECTOR  2: BODY  7: CONDUCTOR

Fig. 3

ARRANGED CONNECTOR 1

1: CONNECTOR

Fig. 4

1: CONNECTOR
10: ELECTRONIC COMPONENT
13: SOLDER BALL
15: ELECTRODE

7: CONDUCTOR
11: SUBSTRATE
14: PRELIMINARY SOLDER

Fig. 5

1: CONNECTOR
11: SUBSTRATE
10: ELECTRONIC COMPONENT
12: SOLDER

Fig. 6

1: CONNECTOR
11: SUBSTRATE
10: ELECTRONIC COMPONENT
12: SOLDER

Fig. 7

STEP.A    STEP.B    STEP.C

STEP.D    STEP.E    STEP.F    STEP.G    STEP.H

1: CONNECTOR    2: BODY    3: METAL THIN FILM
4: PHOTORESIST    5: PHOTOMASK    6: LIGHT
7: CONDUCTOR

STEP A : FORMING BODY 2 INTO PRISMATIC SHAPE

STEP B : FORMING METAL THIN FILM 3 ON THE SURFACE OF BODY 2

STEP C : COATING SURFACE OF METAL THIN FILM WITH PHOTORESIST

STEP D : EXPOSING PHOTORESIST WITH PHOTOMASK HAVING SLIT GAP

STEP E : DEVELOPING

STEP F : APPLYING Cu ELECTROLYTE PLATING

STEP G : REMOVING PHOTORESIST

STEP H : REMOVING METAL THIN FILM

Fig. 8

101 : CHIP
102 : INSULATING LAYER
102A : NON-PHOTOSENSITIVE POLYIMIDE
102B : PHOTOSENSITIVE POLYIMIDE
103 : METAL WIRING
104 : SOLDER BALL
105 : PAD
106 : SIDE
107 : NON-PHOTOSENSITIVE POLYIMIDE FILM

Fig. 9

151 : BGA PACKAGE
152 : ELECTRODE
153 : MULTILAYER SUBSTRATE
154 : INTERPOSER
154a : CIRCUIT WIRING
155 : SEALING RESIN
156,159 : Ag PASTE
157 : BUMP
157a : RESIN BALL
157b : TIN PLATING
158 : WIRING LAYER

TECHNIQUE FOR MODERATING STRESSES CAUSE BY A DIFFERENCE IN THERMAL EXPANSION COEFFIECIENTS BETWEEN A SUBSTRATE AND AN ELECTRONIC COMPONENT

BACKGROUND OF THE INVENTION

The present invention relates to a technique of manufacturing (e.g., soldering and mounting) a device (e.g., BGA type semiconductor package on a printed wiring substrate). In particular, it relates to a technique of moderating stresses caused by the difference of thermal expansion coefficient between a substrate (e.g., printed wiring substrate) and a electronic component (e.g., BAG type semiconductor package) thereby preventing damages to a interface between the substrate and the electronic component.

The number of pins in the electronic component (e.g., Large scale integrated circuit, BGA type semiconductor packages) is increasing. Further, for ensuring more number of pins, the pin pitch has become finer and size of the electronic component has been increased.

The electronic component is mounted on the substrate. Accordingly, if the thermal expansion coefficient of the electronic component is different from that of the substrate, thermal stress occurs at the interface due to the temperature change caused by operation of the electronic component. The stress becomes larger as the size of the electronic component becomes larger or the pin pitch becomes finer. Then, due to the thermal stress, failures such as cracks may sometimes occur at the interface between the substrate and the electronic component, and reliability of the interface is deteriorated.

For example, when a circuit board of the electronic component is made of alumina ceramic, the thermal expansion coefficient is about 7 ppm/K. On the other hand, the thermal expansion coefficient of the substrate is about 16 ppm/K. The difference is about 9 ppm/K. Accordingly, large thermal stress occurs at the interface between the substrate and the electronic component. Therefore, failures such as cracks are caused by the thermal stress.

In view of the above, the following related art has been disclosed to solve such problems.

Figure 8:
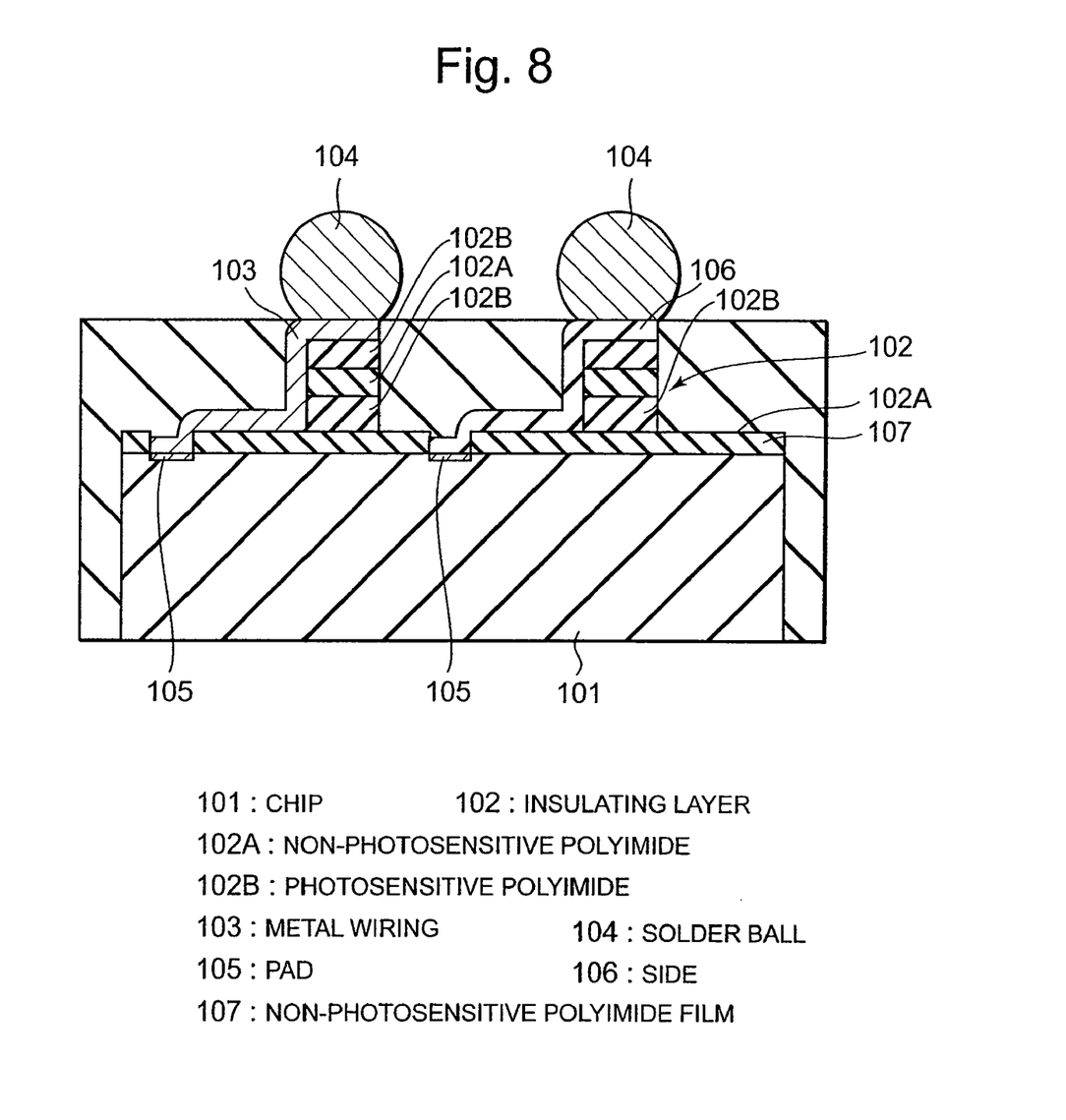
FIG. 8 is a cross sectional view of a BGA type semiconductor device described in Japanese patent application Laid-open No. 2000-58706.

FIG. 8 shows a cross sectional view of a BGA type semiconductor device disclosed in Japanese Patent Application Laid-open No. 2000-58706. Pad 105 are arranged each at a predetermined position of a chip 101. The surface of the chip 101 excluding the pad 105 is covered with a non-photosensitive polyimide film 107. A photosensitive polyimide 102B is formed at a predetermined pattern to a corresponding location of a solder ball 104. A non-photosensitive polyimide 102A is formed on the photosensitive polyimide 102B. And the photosensitive polyimide 102B is layered on the non-photosensitive polyimide 102A. The polyimide films are stacked alternately to form an insulating layer 102. The insulating layer 102 is coated with a metal wiring 103. A side 106 of the insulating layer 102 and the non-photosensitive polyimide film 107 are coated with the metal wiring 103. The metal wiring 103 is connected to the pad 105. Then, the solder ball 104 is attached on the metal wiring 103.

The BGA type semiconductor device disclosed in Japanese Patent Application Laid-open No. 2000-58706, has an elastic insulating layer 102 prepared by stacking the polyimide resin above the chip 101. Cracks caused by thermal stress can be prevented by the elasticity of the insulating layer 102. By preventing cracks, the life of solder is extended.

Japanese Patent Application Laid-open No. 2000-277923 describes a structure of mounting a BGA semiconductor package to a substrate. In the structure, the BGA pad has an insulating resin of low-elasticity. Japanese Patent Application Laid-open No. 2000-277923 discloses a technique of absorbing the thermal stress caused by the difference of thermal expansion coefficient between the substrate and the BGA semiconductor package.

Figure 9:
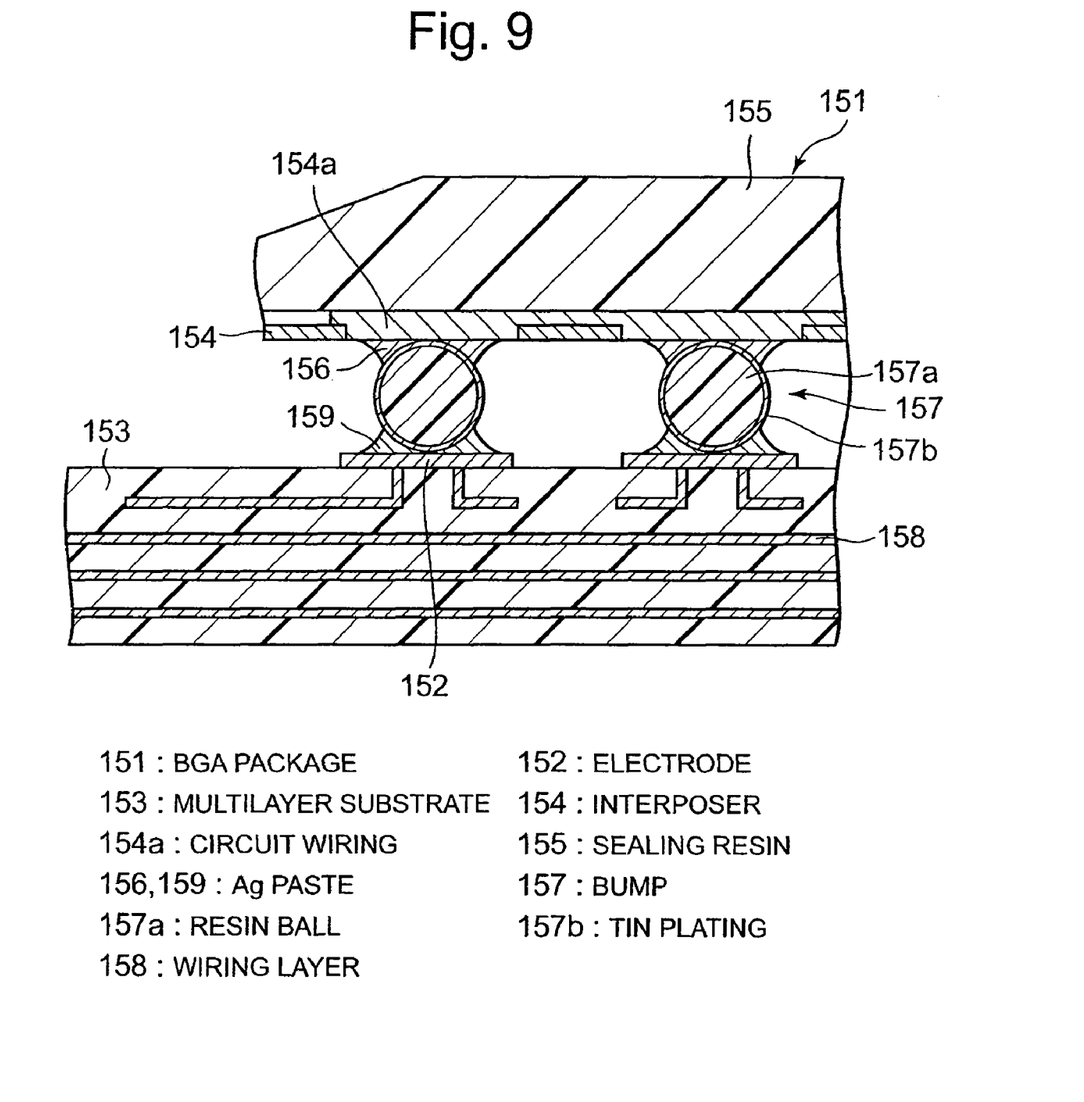
FIG. 9 is a cross sectional view showing a mounting structure of an electronic part described in Japanese Patent Application Laid-open hei No. 11-284029.

FIG. 9 is a view showing a mounted structure of an electronic component described in Japanese Patent Application Laid-open hei No. 11-284029. FIG. 9 is a cross sectional view of mounting a BGA package 151 to a multilayer substrate 153 having electrodes 152. Electrodes 152 which is formed each at a predetermined arrangement are arranged on the multilayer substrate 153 having a number of stacked wiring layers 158. The BGA package 151 is made by bellow. First, a semiconductor chip is mounted on an interposer 154 having a circuit wiring 154a by using an adhesive. Second, the semiconductor chip is electrically connected with the circuit wiring 154a by using Au (gold) wire. Third, the semiconductor chip and the Au wires are sealed by a sealing resin 155. Holes are formed in an array to the interposer 154 placed on the surface of the BGA package 151 opposed to the multilayer substrate. By fixing a conductive ball using an Ag (silver) paste 156 coated in the hole as a conductive adhesive, bumps 157 are arranged in an array at the face of the BGA package 151. The conductive ball constituting the bump 157 comprises a resin ball 157a coated with tin plating 157b. The arrangement pattern of the electrodes 152 corresponds to the arrangement of the bumps 157. When the BGA package 151 is mounted on the multilayer substrate 153, the bump 157 and the electrode 152 are adhered and secured respectively using the Ag paste 159.

According to the related art disclosed in Japanese Patent Application Laid-open hei No. 11-284029, when an impact is applied from the outside to the BGA package 151 and the multilayer substrate 153, the resin ball 157a is elastically deformed. Therefore, the failure caused by the stress is prevented.

Further, Japanese Patent Application Laid-open hei No. 10-173006 describes a semiconductor device in which an electrode of a semiconductor chip and a conductor of a wiring substrate are flip-chip connected by using a conductive material on the side of the semiconductor chip, a conductive resin ball comprising a resin ball and a conductive layer covering the surface thereof, and a conductive material on the side of the wiring substrate. Thus, the thermal stress caused by the difference of the thermal expansion efficient between the semiconductor chip and the wiring substrate is moderated by the deformation of the resin ball at low elasticity to improve the reliability of a connecting section. A shape of the conductive connecting element for connecting the semiconductor chip and the wiring substrate is not restricted to the spherical shape but may also be an optional shape such as columnar shape, a prismatic shape or the like.

SUMMARY OF THE INVENTION

However, the related arts described above have problems shown below.

The related art disclosed in Japanese Patent Application Laid-open No. 2000-58706 or Japanese Patent Application Laid-open No. 2000-277923 intends to moderate the thermal stress caused by difference of the thermal expansion coefficient between the BGA type semiconductor package and the substrate. For moderating the thermal stress, a elastic component moderating the stress is attached above a semiconductor chip in a step of mounting the BGA type semiconductor package on the substrate. Further, in the related art disclosed in Japanese Patent Application Laid-open hei No. 11-284029, conductive balls having the elastic resin are attached as a conductive adhesive to the BGA package. Thermal stress is moderated by the elastic resin.

As described above, in any of the techniques, it is necessary to modify the BGA type semiconductor package or the substrate. Therefore, standard products can not be used in any of the techniques described above. And any of techniques described above does not disclose that a connector having an elasticity is put between the wiring substrate and the BGA type semiconductor package to moderate the thermal stress.

Further, the related art disclosed in Japanese Patent Application Laid-open hei No. 10-173006 has a structure of using the conductive resin ball containing the resin ball of low elasticity in the central portion and bonding the electrode of the semiconductor chip and the conductor of the wiring substrate. However, in a case of utilizing the technique, one connecting element is necessary on each connecting section. Accordingly, when the electrodes of the semiconductor chip are present in a grid-pattern by the number of 30×30, connecting elements by the number of 900 in total are necessary.

The present invention intends to provide the device (e.g., BGA type semiconductor device) of moderating the thermal stress caused by the difference of the thermal expansion coefficient between the electronic component (e.g., BGA type semiconductor package) and the substrate. Also, the present invention intends to improve the reliability at the interface between the electronic component (e.g., BGA type semiconductor package) and the substrate, as well as a manufacturing method thereof.

A device according to a first aspect of the present invention comprises: a plurality of first electrodes which are arranged on a surface of a substrate at predetermined space; a component which has an elasticity and a longitudinal axis; a plurality of conductors which are applied to a surface of said component at predetermined space, and each of which are connected to a corresponding one of said first electrodes; and a plurality of second electrodes which are arranged on a surface of a electronic component at predetermined space, and each of which are connected to a corresponding one of said conductors.

A connector comprising: a body which has an elasticity and a longitudinal axis; a plurality of conductors which are applied to a surface of said body at predetermined space.

A method for manufacturing a device comprising: providing substrate which has a plurality of first electrodes arranged each at a predetermined space, a component which has an elastic body with a longitudinal axis and a plurality of conductors applied on a surface of said elastic body a predetermined space apart each other, electronic component which has a plurality of second electrodes arranged each at predetermined space; locating each of said conductor above any one of said first electrode; supplying a bonding material between said conductor and said first electrode; locating each of said second electrode above any one of said conductor; supplying said bonding material between said second electrode and said conductor; and heating said bonding material.

A method for manufacturing a connector comprising: shaping an elastic body into a shape with a longitudinal axis; forming a metal film on the surface of said elastic body; coating a photoresist on said metal film; heating said photoresist to form a resist film; exposing said resist film by way of a photomask formed with a slit having a predetermined gap while rotating said elastic body; removing said exposed resistor film; plating an electrode material to said metal film revealed; removing said resist film; and removing said metal film.

BRIEF DESCRIPTION OF THE DRAWINGS

Other features and advantages of the invention will be made more apparent by the following detailed description and the accompanying drawings, wherein.

DETAILED DESCRIPTION OF THE PREFERRED EMBODIMENTS

An embodiment of the present invention will be described in detail below.

Figure 1:
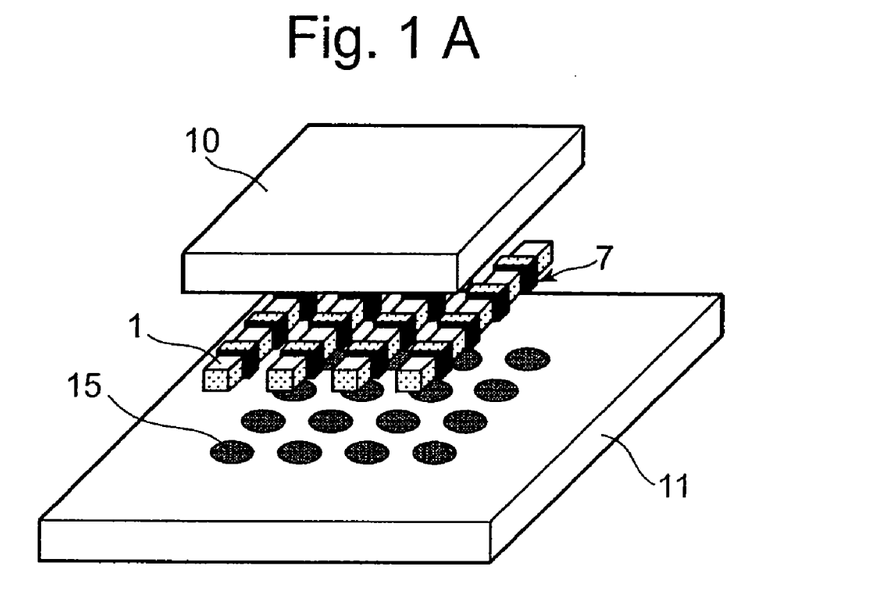
FIG. 1A is a perspective view showing a device (e.g., BGA type semiconductor device) according to an embodiment of the present invention.
FIG. 1B is a vertical cross sectional view showing a device (e.g., BGA type semiconductor device) according to the embodiment of the present invention.

As shown in FIG. 1A, a device (e.g., a BGA type semiconductor device) of the embodiment has a plurality of connectors 1 arranged on a substrate 11. A electronic component 10 (e.g., BGA type electronic component) is mounted above the connector 1. A plurality of electrodes 15 are arranged 2-dimensionally on the substrate 11 along lines perpendicular to each other. Further, solder balls (not shown in FIG. 1A) are formed to the electronic component 10 on the surface opposite to the substrate 11. And, the location of each solder ball corresponds to the location of any one of electrode 15.

Figure 2:
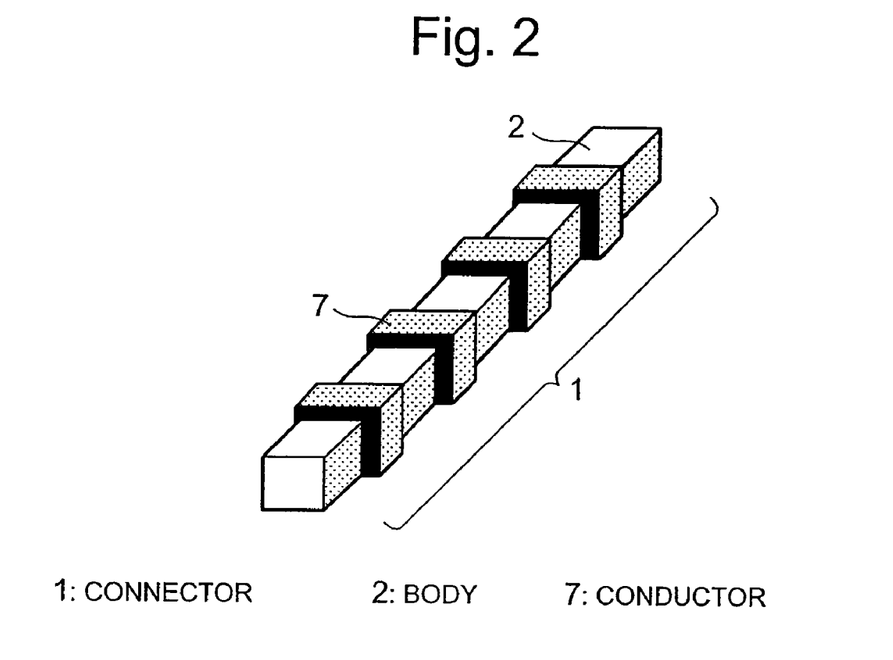
FIG. 2 is a perspective view showing a connector in the device (e.g., BGA type semiconductor device) according to the embodiment of the present invention.
Figure 3:
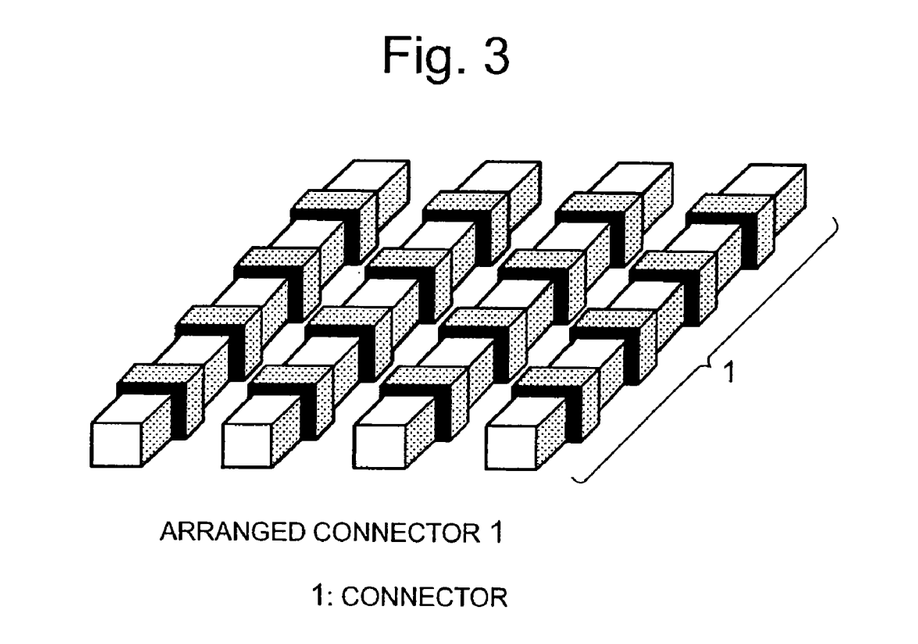
FIG. 3 is a perspective view in which the connector shown in FIG. 2 is arranged in plurality.

The connector 1 is to be described with reference to FIG. 2. As shown in FIG. 2, the connector 1 has a body 2 which has an elasticity. For example, the shape of the body 2 is a prismatic shape. The shape of the body 2 is not restricted to the prismatic shape. For example, the body 2 comprises a silicone rubber. The material of the body 2 is not restricted to the silicone rubber. A plurality of conductors 7 are applied to a surface of the body 2 at predetermined space. The conductors 7 are applied to the outer surface of the body 2. For example, the conductor 7 comprises a cupper (Cu). The conductors 7 are applied along the longitudinal axis of the body 2. The location of each conductor 7 corresponds to the location of any one of the electrode 15. In other words, the space between the conductors 7 corresponds to the space between the electrodes 15. When the arrangement of the solder balls (not shown in FIG. 2) and the electrodes 15 is such that the space between the centers for each of the solder balls and the electrodes 15 is 1 mm for 20 rows×20 rows, the size of the body 2 is, for example, about 0.5 mm width and 0.5 mm thickness, and the length is about 20 to 22 mm. Further, for example, the conductors 7 are such that the space between the centers of each of the conductors 7 is 1 mm, and the width of the conductor 7 is about 0.5 mm. The connector 1 are arranged by the number of 20 each at 1 mm space (for example, refer to FIG. 3), and the conductors 7, the electrode 15, and the solder ball are connected respectively. In this case, the connector 1 is put between the substrate 11 and the electronic component 10, and then is soldered. As described above, the device (e.g., BGA type semiconductor device) shown in FIG. 1A is formed. While description has been made for the connector 1 for an example of arranging them individually corresponding to each of the electrode 15, it is possible for the present invention that the connectors 1 are integrated in some or other shape.

Further, FIG. 1B is a vertical cross sectional view of a device (e.g., BGA type semiconductor device) as shown in FIG. 1A. Each electrode 15 is placed at predetermined location on the substrate 11. A solder 12 is supplied on each of the electrode 15. The connector 1 is located above the solder 12. In other words, the conductor 7 of the connector 1 is located above the electrodes 15. The solder 12 is supplied on each of the conductor 7. The connector 1 and the electrode 15 formed on the surface of the electronic component 10 are bonded by the solder 12, therefore, the electronic component 10 is mounted above the substrate 11.

Next, the operation of the device (e.g., BGA type semiconductor device) is described. For example, when a substrate of the electronic component 10 is alumina ceramics, the thermal expansion coefficient is about 7 ppm/K, while the thermal expansion coefficient of the substrate 11 is about 16 ppm/K. Accordingly, when the operation temperature or the circumstantial temperature for the electronic component 10 changes, positional displacement occurs between the electrode at the outer area of the electronic component 10 and the electrode 15 of the substrate 11 by the difference of the thermal expansion coefficient. In the conventional device which does not have the connector 1 of the present invention, the positional displacement gives directly a stress to the solder. However, in the present invention, since the body 2 elastically deforms, the stress caused by the positional displacement is absorbed and the stress given to the solder is decreased remarkably.

Next, some effect of the present invention is described. In the device (e.g., BGA type semiconductor device) according to the embodiment, since the connector 1 comprising the body 2 which has an elasticity is located between the substrate 11 and the electronic component 10, the stress given to the solder is reduced. As a result, the reliability of the solder portion is improved. Accordingly, a large-scale multi-pin electronic component mounting can be attained with high-reliability, and the possibility of providing an apparatus capable of processing more information at high speed is extended. Further, since the connector 1 is placed on the row of the electrodes 15, the number of parts for reducing the stress is decreased compared with the related art. Further, since the connector 1 is located between the substrate 11 and the electronic component 10, standard products manufactured by existent technique can be used for the substrate 11 and the electronic component 10.

Figure 4:
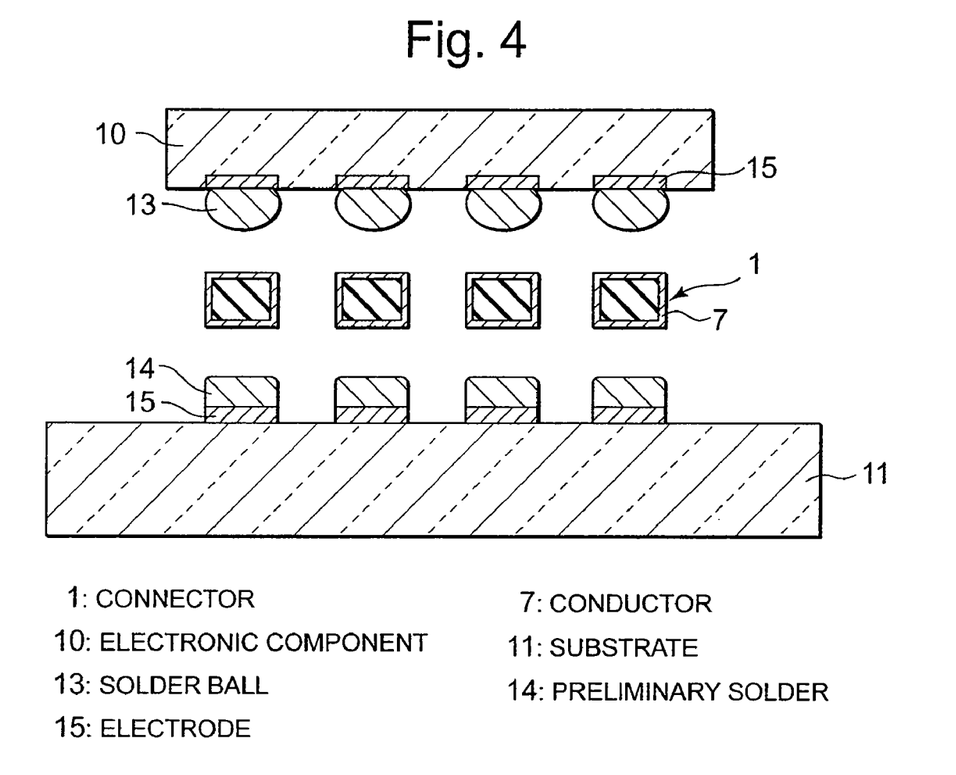
FIG. 4 is a vertical cross sectional view showing the assembling procedures of the device (e.g., BGA type semiconductor device)
Figure 5:
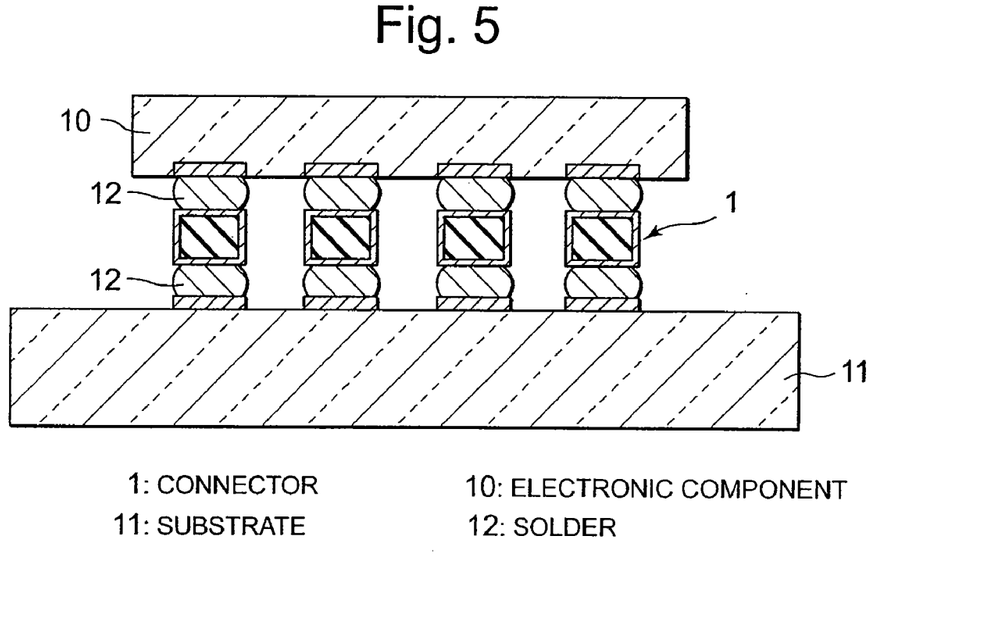
FIG. 5 is a vertical cross sectional view showing the device soldered.
Figure 6:
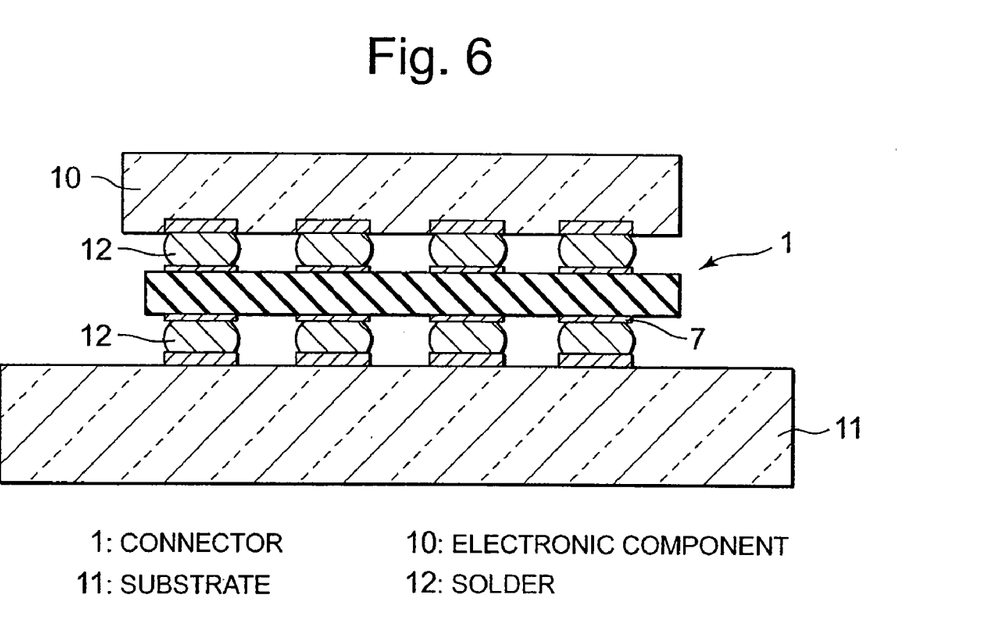
FIG. 6 is a vertical cross sectional view from the direction that is perpendicular to the normal line of the cross section shown in FIG. 5.

Next, the method for manufacturing the device (e.g., BGA type semiconductor device) of the embodiment is described with reference to FIG. 4, FIG. 5, and FIG. 6. As shown in FIG. 4, preliminary solder 14 is supplied on the electrodes 15 of the substrate 11. For example, this may be conducted by a general method of supplying by printing a creamy solder paste. Then, the location of the conductor 7 is adjusted to the location of the preliminary solder 14. And then, the connector 1 is mounted on the preliminary solder 14. The connector 1 is arranged by as much as the rows of the electrodes 15. Then, the location of a solder ball 13 is adjusted to the location of the conductor 7. And then, the electronic component 10 is mounted above the connector 1. It is preferred to previously coat a flux at the top end of the solder ball 13 for making solderability favorable. Then, soldering is completed by reflow heating at a temperature higher than the melting point of the solder in a state of piling the substrate 11, the connector 1, and the electronic component 10. When the material for the preliminary solder 14 and the solder ball 13 comprises Sn 63/Pb 37 mass %, the soldering is completed by conducting heat reflow at about 210° C. When the material is a lead-free solder comprising Sn 96.5/Ag 3.0/Cu 0.5 mass %, the soldering is completed by conducting heat reflow at about 240° C. FIG. 5 is a vertical cross sectional view showing the device soldered. FIG. 6 is a vertical cross sectional view from the direction that is perpendicular to the normal line of the cross section shown in FIG. 5.

Figure 7:
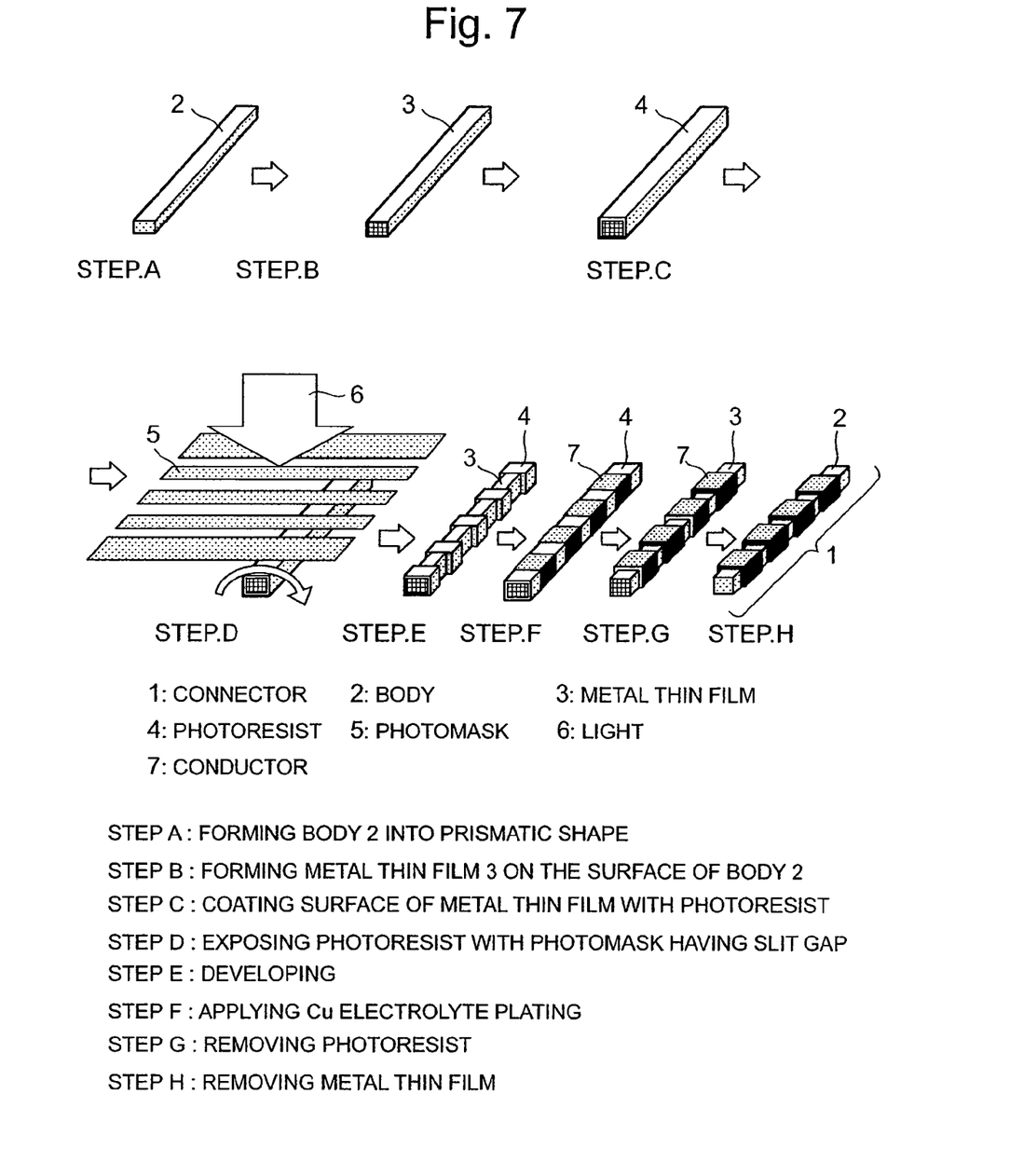
FIG. 7 is a perspective view the manufacturing process of the connector.

Next, a method for manufacturing the connector 1 is to be described with reference to FIG. 7. FIG. 7 is a perspective view showing the procedure for manufacturing the connector 1. As shown at step A in FIG. 7, the body 2 is formed into a prismatic shape. However, the prismatic shape of the body 2 is an example among many. The shape of the body 2 is not restricted to the prismatic shape. For example, a Thermosetting liquid silicone rubber is cast into a slit die and heat cured to mold the body 2 into a desired shape. Then, as shown at step B in FIG. 7, a metal thin film 3 is formed by a method of electroless Cu plating or Cu sputtering, as the undercoated electrode for applying electrolytic plating to the body 2. The method for forming the metal thin film 3 is not restricted to the method of electroless Cu plating or Cu sputtering. Since it is necessary to apply the metal thin films 3 to the entire outer surface of the body 2, the metal thin film 3 is formed while rotating or overturning the body 2. The thickness of the metal thin film 3 may be, for example, about from 0.01 to 0.1 µm. Then as shown at step C in FIG. 7, a photoresist 4 is coated over the entire surface of the metal thin film 3. As the coating method, the body 2 coated with the metal thin film 3 is dipped into a liquid resist solution, pulling up from the solution, and then heat cured to form a uniform resist film. Then, as shown at step D, the photoresist 4 is exposed by irradiating a light from above, with a photomask 5 having a slit gap equal with the width of the conductor 7. For example, by applying the exposure treatment while rotating the body 2 each by 90 degree, exposure for four surfaces of the photoresist 4 of the body 2 is completed. Then, as shown at step E in FIG. 7, the exposed resist film was removed by development to reveal the metal thin film 3. Then, as shown at step F in FIG. 7, Cu electrolytic plating is applied to the exposed metal thin film 3. Preferably, the thickness of the Cu plating is, for example, from 10 to 30 µm. However, the material for the electrolytic plating is not restricted to the copper. Then, as shown at step G in FIG. 7, the photoresist 4 is entirely removed by a photoresist dissolving solution to reveal the metal thin film 3. Finally, as shown at step H in FIG. 7, the revealed metal thin film 3 is removed by dissolving with a chemical. In this case, while the conductor 7 is also dissolved, since the treatment may be in such a short period of time as removing the metal thin film 3, this gives no undesired effect on the thickness of the conductor 7. Manufacture of the connector 1 is completed by the steps described above.

For the electrode material of the connector 1, while description has been made to Cu as an example, since Cu is a material easily soluble to the solder, an electrode material comprising Cu, Ni, and Au may also be used from the underlying layer. Further, in the manufacture of the connector 1, it is efficient to manufacture from a long body 2 and cut the same into a desired size for use.

Further, as the material for the body 2, while description has been made to the silicone rubber as an example, the effect of reducing the stress applied to the solder bonded portion can be obtained so long as the material has an elasticity equal with or less than that of the solder material. Accordingly, materials, for example, an epoxy resin may also be used.

Further, in FIG. 5, it may be considered that the solder is out onto the side different from the solder bonding portion of the connector 1 upon soldering step. This may be overcome by previously coating a solder resist on the lateral surface of the bonding part, or using a material having less wettability with solder (e.g., Ni) on the surface of the connector 1.

What is claimed is:

1. A device comprising:
   a plurality of first electrodes which are arranged on a surface of a substrate at a predetermined spacing;
   a component which has an elasticity and a longitudinal axis, said component being substantially prismatic in shape;
   a plurality of conductors which are applied to a surface of said component at a spacing corresponding to said predetermined spacing, each of the conductors surrounding said component in a plane substantially crossing said longitudinal axis and each of the conductors being connected on one side of said component to a corresponding one of said first electrodes; and
   a plurality of second electrodes which are arranged on a surface of an electronic component at a spacing corresponding to said predetermined spacing, and each of which are connected on the other side of said component to a corresponding one of said conductors.

2. The device according to claim 1, wherein said conductor comprises:
   a first contactor which is connected to said corresponding one of said first electrodes;
   a second contactor which is connected to said corresponding one of said second electrodes; and
   a connector which connects said first contactor to said second contactor.

3. The device according to claim 2, wherein said first contactor has a surface contact with said first electrode; and
   wherein said second contactor has a surface contact with said second electrode.

4. The device according to claim 2, wherein said first contactor is substantially in parallel with said second contactor.

5. The device according to claim 1, wherein said conductor comprises:
   a first contactor which is connected to said corresponding one of said first electrodes;
   a second contactor which is connected to said corresponding one of said second electrodes; and
   a connector which connects said first contactor to said second contactor;
   wherein said component comprises:
   a first plane which has said first contactor;
   a second plane which has said second contactor, and is located on an opposite side of said first plane; and
   a third plane which has said connector.

6. The device according to claim 1, wherein a cross-section of said component is of a quadrilateral shape; and
   wherein said cross-section is substantially perpendicular to said longitudinal axis.

7. The device according to claim 1, wherein said component comprises a silicone rubber.

8. The device according to claim 1, wherein said component comprises an epoxy resin.

9. The device according to claim 1, wherein said conductor comprises a copper.

10. The device according to claim 1, wherein said electronic component is a BGA type and said second electrode is a solder ball.

11. A connector comprising:
    a body which has an elasticity and a longitudinal axis, said body being substantially prismatic in shape;
    a plurality of conductors which are applied to a surface of said body at a predetermined spacing, each of the conductors surrounding said component in a plane substantially crossing said longitudinal axis.

12. The connector according to claim 11, wherein said conductor comprises:
    a first contactor which corresponds to first electrode;
    a second contactor which corresponds to second electrode; and
    a conduction element which connects said first contactor to said second contactor.

13. The connector according to claim 12, wherein said first contactor is substantially in parallel with said second contactor.

14. The connector according to claim 11, wherein said conductor comprises:
    a first contactor which corresponds to first electrode;
    a second contactor which corresponds to second electrode; and
    a conduction element which connects said first contactor to said second contactor;
    wherein said body comprises:
    a first plane which has said first contactor;
    a second plane which has said second contactor, and is located on an opposite side of said first plane; and
    a third plane which has said conduction element.

15. The connector according to claim 11, wherein a cross-section of said body is of a quadrilateral shape; and
    wherein said cross-section is substantially perpendicular to said longitudinal axis.

16. The connector according to claim 11, wherein said body comprises a silicone rubber.

17. The connector according to claim 11, wherein said body comprises an epoxy resin.

18. The connector according to claim 11, wherein said conductor comprises a copper.

* * * * *